(12) United States Patent
Zang (10) Patent No.: US 9,608,087 B2
(45) Date of Patent: Mar. 28, 2017

(54) INTEGRATED CIRCUITS WITH SPACER CHAMFERING AND METHODS OF SPACER CHAMFERING

(71) Applicant: GLOBALFOUNDRIES Inc., Grand Cayman (KY)

(72) Inventor: Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/681,428

(22) Filed: Apr. 8, 2015

(65) Prior Publication Data

US 2016/0300922 A1   Oct. 13, 2016

(51) Int. Cl.
*H01L 21/336* (2006.01)
*H01L 29/66* (2006.01)
*H01L 21/3213* (2006.01)
*H01L 29/78* (2006.01)

(52) U.S. Cl.
CPC .... *H01L 29/6656* (2013.01); *H01L 21/32139* (2013.01); *H01L 29/6653* (2013.01); *H01L 29/66545* (2013.01); *H01L 29/66795* (2013.01); *H01L 29/7851* (2013.01)

(58) Field of Classification Search
CPC .................................................. H01L 29/6656
USPC .......................................................... 438/284
See application file for complete search history.

(56) References Cited

U.S. PATENT DOCUMENTS

| 2015/0014788 A1* | 1/2015 | Park | H01L 29/66545 257/401 |
| 2015/0325575 A1* | 11/2015 | Park | H01L 29/0653 257/401 |

OTHER PUBLICATIONS

U.S. Appl. No. 13/929,923, filed Jun. 28, 2013, Hui Zang, "Spacer Chamfering for a Replacement Metal Gate Device".

* cited by examiner

*Primary Examiner* — Ajay K Arora
(74) *Attorney, Agent, or Firm* — Heslin Rothenberg Farley & Mesiti P.C.; Jacquelyn Graff (57) ABSTRACT

Semiconductor devices and methods for forming the devices with spacer chamfering. One method includes, for instance: obtaining a wafer with at least one source, at least one drain, and at least one fin; forming at least one sacrificial gate with at least one barrier layer; forming a first set of spacers adjacent to the at least one sacrificial gate; forming at least one second set of spacers adjacent to the first set of spacers; and etching to remove a portion of the first set of spacers above the at least one barrier layer to form a widened opening. An intermediate semiconductor device is also disclosed.

12 Claims, 13 Drawing Sheets

INTEGRATED CIRCUITS WITH SPACER CHAMFERING AND METHODS OF SPACER CHAMFERING

FIELD OF THE INVENTION

The present invention relates to semiconductor devices and methods of fabricating semiconductor devices, and more particularly, to integrated circuits with spacer chamfering and fabrication methods using spacer chamfering.

BACKGROUND OF THE INVENTION

As semiconductor devices continue to decrease in size, the work-function metal chamfering process and subsequent metal fill process are becoming more challenging. The currently available chamfering and metal fill processes have made it difficult to achieve the desired metal gate structures without shorts and with the desired yield and low resistance. Thus, new chamfering and metal fill processes are needed.

SUMMARY OF THE INVENTION

The shortcomings of the prior art are overcome and additional advantages are provided through the provision, in one aspect, a method includes obtaining a wafer with at least one source, at least one drain, and at least one fin; forming at least one sacrificial gate with at least one barrier layer; forming a first set of spacers adjacent to the at least one sacrificial gate; forming at least one second set of spacers adjacent to the first set of spacers; and etching to remove a portion of the first set of spacers above the at least one barrier layer to form a widened opening.

In another aspect, a device is provided which includes, for instance: a substrate; at least one source and at least one drain positioned on the substrate; at least one fin connecting the at least one source and the at least one drain; at least one portion of a sacrificial gate including a polysilicon layer and a barrier layer positioned over the polysilicon layer; a first set of spacers positioned adjacent to the polysilicon layer and the barrier layer of the sacrificial gate; at least one second set of spacers positioned adjacent to the first set of spacers on a side opposite the at least one portion of the sacrificial gate; and a widened partial gate contact opening positioned over the first set of spacers and the barrier layer, wherein a top surface of the first set of spacers is positioned between a top surface and a bottom surface of the second set of spacers.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with better uniformity in spacer chamfering and low resistance.

Figure 1:
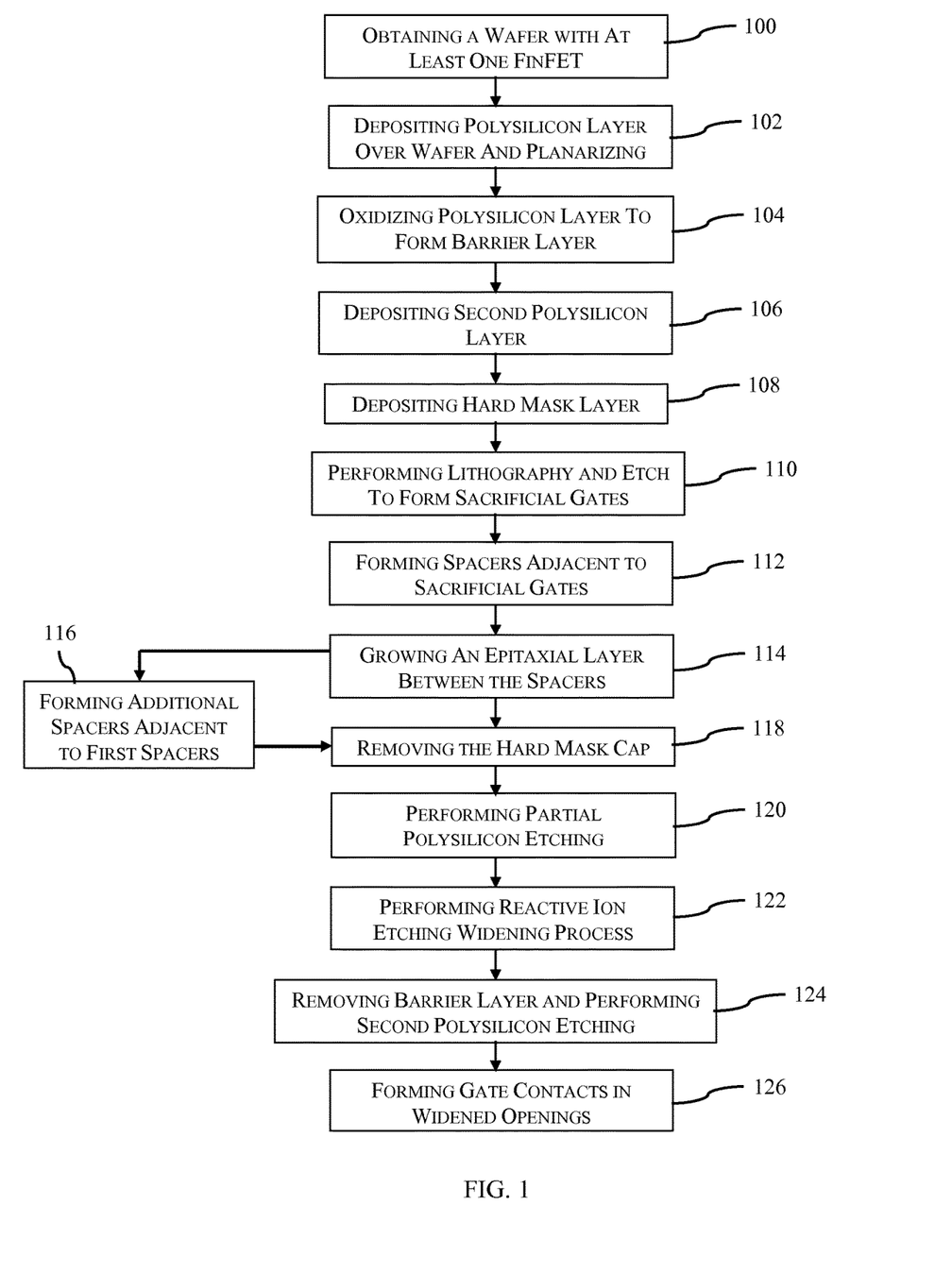
FIG. 1 depicts one embodiment of a method for forming an integrated circuit with spacer chamfering, in accordance with one or more aspects of the present invention.

In one aspect, in one embodiment, as shown in FIG. 1, semiconductor device formation process in accordance with one or more aspects of the present invention may include, for instance: obtaining a wafer with at least one FinFET device 100; depositing a polysilicon layer over the wafer and performing planarization 102; oxidizing the polysilicon layer to form a barrier layer 104; depositing a second polysilicon layer over the device 106; depositing a hard mask layer over the wafer 108; performing lithography and etching to form sacrificial gates 110; forming spacers adjacent to the sacrificial gates 112; growing an epitaxial layer between the spacers 114; optionally forming additional spacers adjacent to the first formed spacers 116; removing the hard mask caps over the sacrificial gates 118; performing a partial polysilicon etching 120; performing a reactive ion etch widening process 122; removing the barrier layer and performing a second polysilicon etching 124; and forming gate contacts in the widened openings 126.

In one embodiment, all spacer layers may be formed before growth of the epitaxial layer. In another embodiment, at least one first spacer layer may be formed before growth of the epitaxial layer and at least one second spacer layer may be formed after growth of the epitaxial layer, as described in greater detail below.

FIGS. 2-23 depict, by way of example only, several detailed embodiments of a portion of the FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 2:
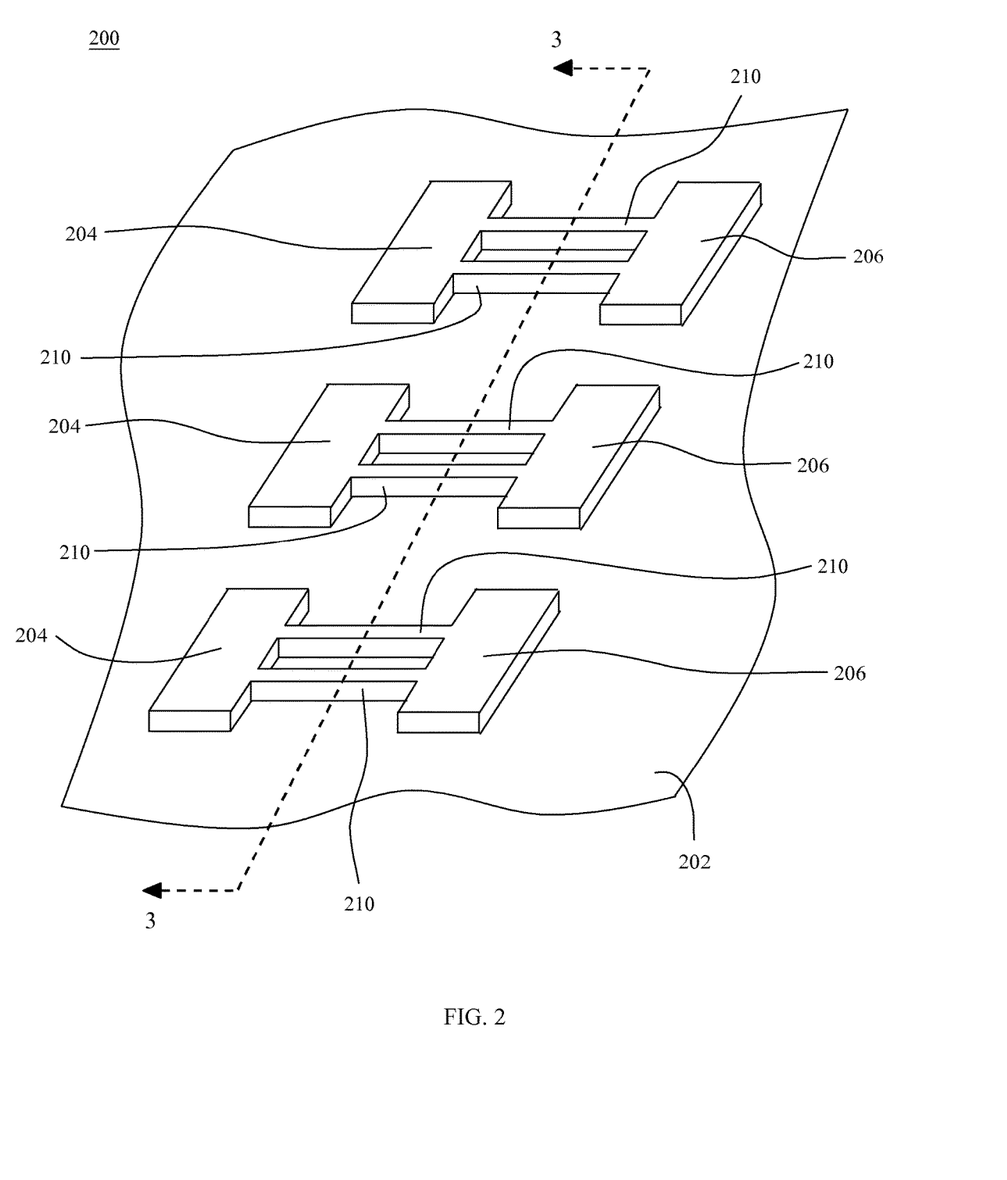
FIG. 2 depicts an isometric view of one embodiment of an integrated circuit with fins connecting source and drain regions disposed over a substrate structure, in accordance with one or more aspects of the present invention.

One detailed embodiment of a portion of the FinFET device formation process of FIG. 1 is depicted, by way of example only, in FIGS. 2-12. FIG. 2 shows a portion of a semiconductor device 200 obtained during the fabrication process. The device 200 may have been processed through initial device processing steps in accordance with the design of the device 200 being fabricated, for example, the device 200 may include, for example, an isolation region 202, at least one source region 204, and at least one drain region 206. It is also contemplated that additional features may be present on the device 200. The at least one source region 204 and at least one drain region 206 are shown positioned over the isolation region 202 for ease of illustration. The at least one source region 204 and at least one drain region 206 may be, for example, embedded silicon germanium (eSiGe) for pFETs or embedded silicon phosphorus (eSiP) for nFETs. The device 200 may also include at least one fin 210 extending between the at least one source region 204 and at least one drain region 206.

Figure 3:
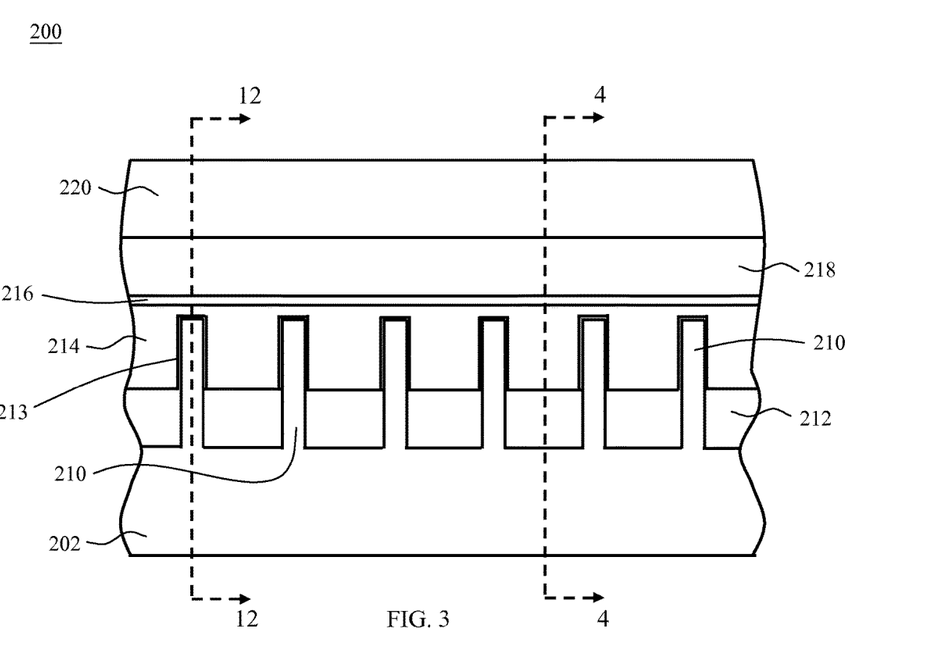
FIG. 3 depicts a cross-sectional elevation view of the semiconductor device of FIG. 2 taken along line 3-3, after forming an oxidation layer, depositing a first polysilicon layer and planarizing, forming a barrier layer, depositing a second polysilicon layer, and depositing a hard mask layer, in accordance with one or more aspects of the present invention.
Figure 4:
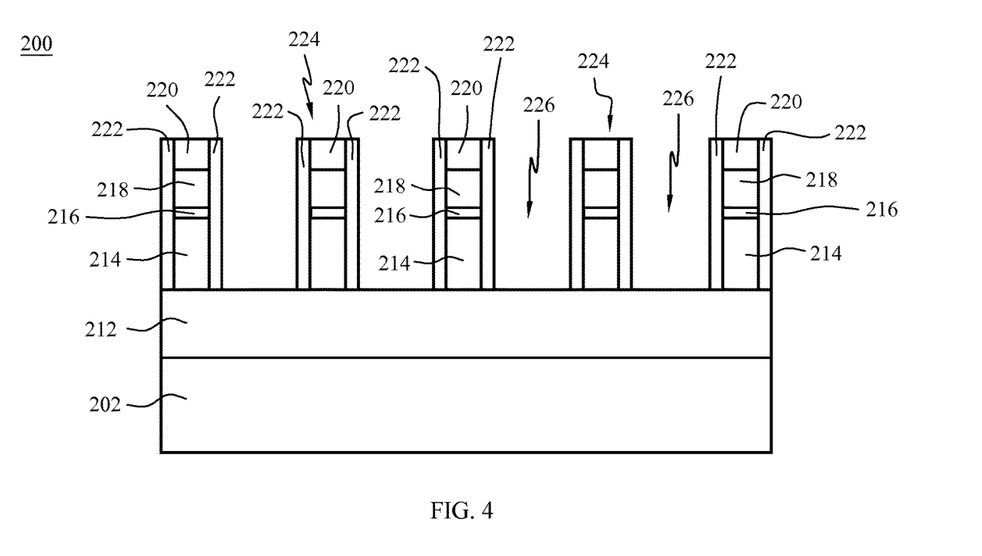
FIG. 4 depicts a cross-sectional elevation view of the semiconductor device of FIG. 3 taken along line 4-4 after performing lithography and etching to form sacrificial gates and forming first spacers next to the sacrificial gates, in accordance with one or more aspects of the present invention.

Referring now to FIGS. 3-12, by way of example only, one embodiment of a portion of the FinFET device formation process of FIG. 1 is shown. As shown in FIG. 3, the device 200 may include an oxide layer 212 deposited over the device 200 of FIG. 2. In addition, an oxidation layer 213 may be formed over the portion of the fins 210 extending over the oxide layer 212 and the oxidation layer 213 may be, for example, approximately 2-3 nm thick. A first polysilicon layer 214 may then be deposited over the device 200 may be planarized by, for example, chemical mechanical planarization (CMP). Next, a barrier layer 216 may be formed over the first polysilicon layer 214. The barrier layer 216 may be, for example, a deposited or formed silicon dioxide ($SiO_2$) layer. The barrier layer 216 may be formed, for example, by oxidizing the polysilicon layer to form a $SiO_2$ layer. The barrier layer 216 may be a thin layer of, for example, approximately 1-4 nm and more preferably 2-3 nm. Next, a second polysilicon layer 218 may be deposited over the barrier layer 216. The second polysilicon layer 218 may be optionally planarized. Then, a hard mask layer 220 may be deposited over the second polysilicon layer 218. The hard mask layer 220 may be, for example, a nitride layer or other material to protect the underlying devices during etching processes. Next, lithography and etching may be performed over the device 200 to form one or more sacrificial gates 224. The one or more sacrificial gates 224 may include a portion of the first polysilicon layer 214, the barrier layer 216, the second polysilicon layer 218, and the hard mask layer 220, as shown in FIG. 4. The hard mask layer 220 may form a hard mask cap 220 on the top of each sacrificial gate 224.

Figure 5:
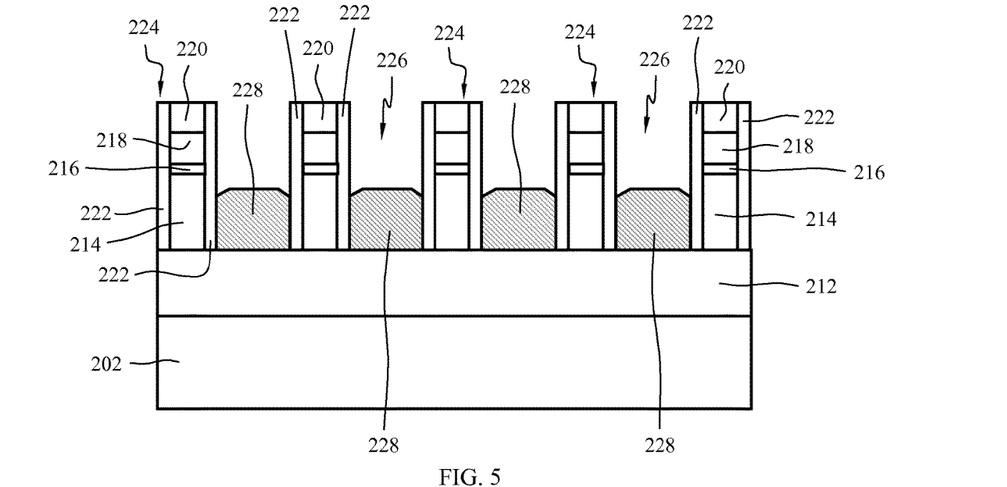
FIG. 5 depicts the structure of FIG. 4 after performing epitaxial growth, in accordance with one or more aspects of the present invention.

An alternative view of the device 200 is shown in FIG. 4, after formation of spacers 222 on the sides of the sacrificial gates 224. The spacers 222 may be formed by known spacer formation methods including, for example, by performing a conformal deposition of the spacer material and a vertical etch to form the spacers 222. Once the spacers 222 are formed, there may be openings 226 between the spacers 222, as shown in FIG. 4. Next, epitaxy may be grown in the openings 226 over the source and drain forming an epitaxial growth layer 228, as shown in FIG. 5. The epitaxial growth layer 228 may be, for example, grown to a height that is below the height of the barrier layer 216.

Figure 6:
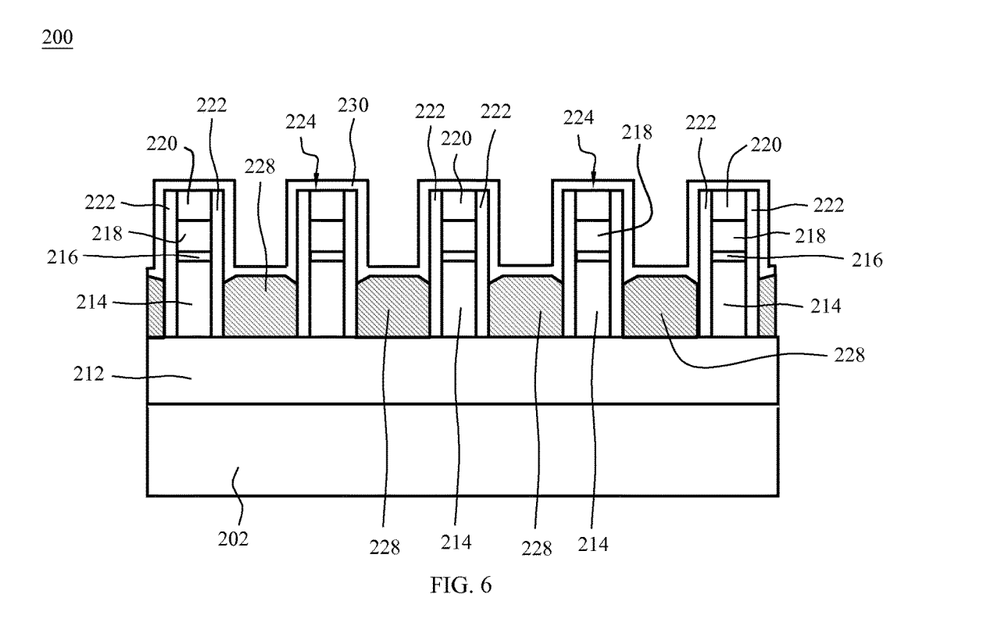
FIG. 6 depicts the structure of FIG. 5 after depositing a conformal layer of spacer material, in accordance with one or more aspects of the present invention.
Figure 7:
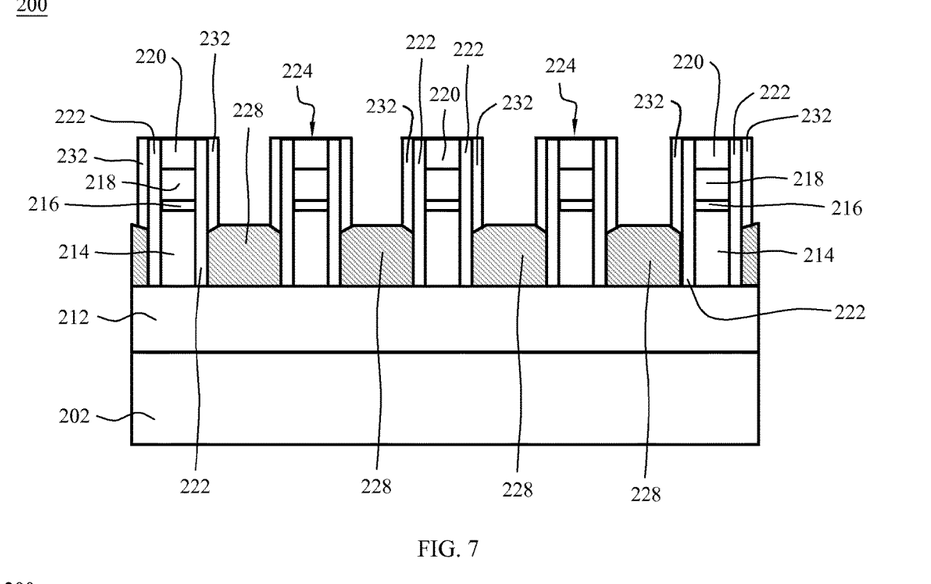
FIG. 7 depicts the structure of FIG. 6 after performing a vertical etch to form second spacers, in accordance with one or more aspects of the present invention.
Figure 8:
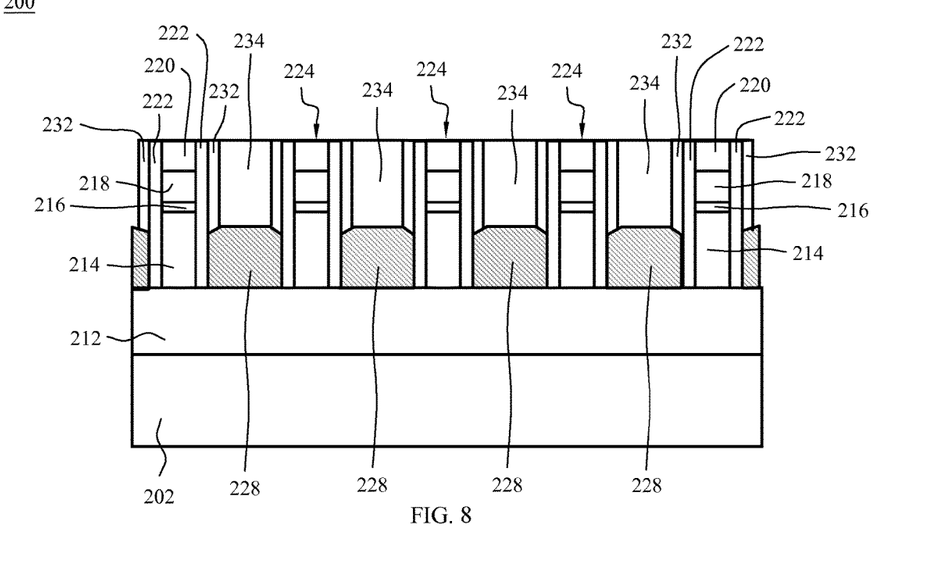
FIG. 8 depicts the structure of FIG. 7 after depositing an oxide layer and performing planarization on the device, in accordance with one or more aspects of the present invention.
Figure 9:
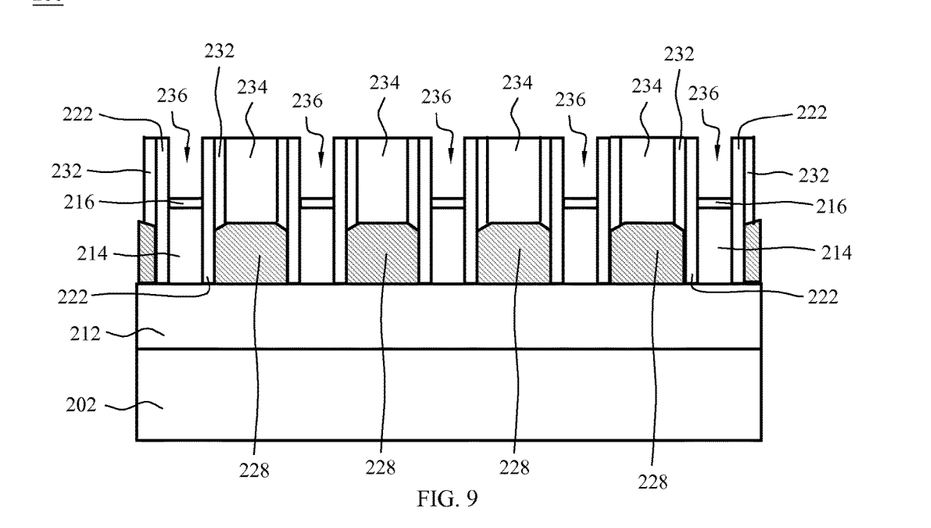
FIG. 9 depicts the structure of FIG. 8 after removing the hard mask caps and performing a partial polysilicon etch to remove the second polysilicon layer, stopping on the barrier layer, in accordance with one or more aspects of the present invention.
Figure 10:
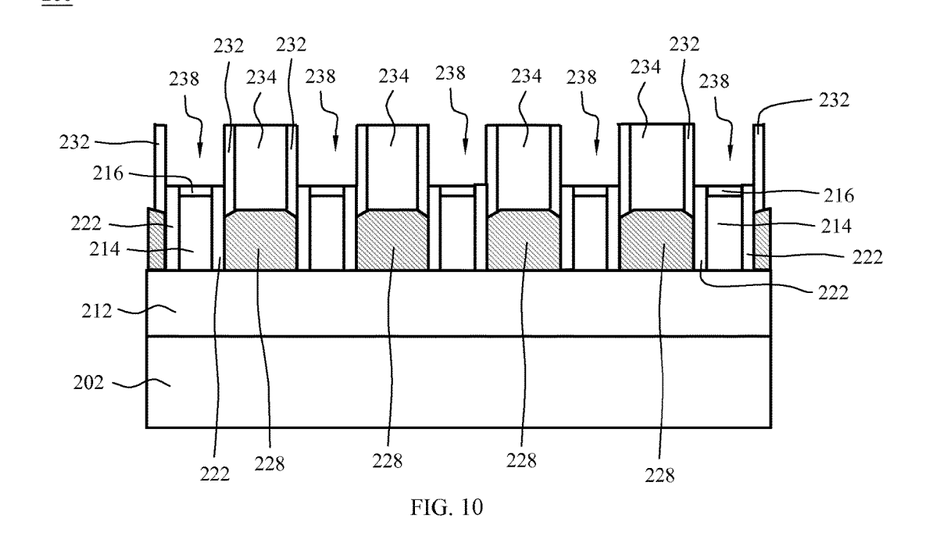
FIG. 10 depicts the structure of FIG. 9 after performing a reactive ion etch widening process, in accordance with one or more aspects of the present invention.
Figure 11:
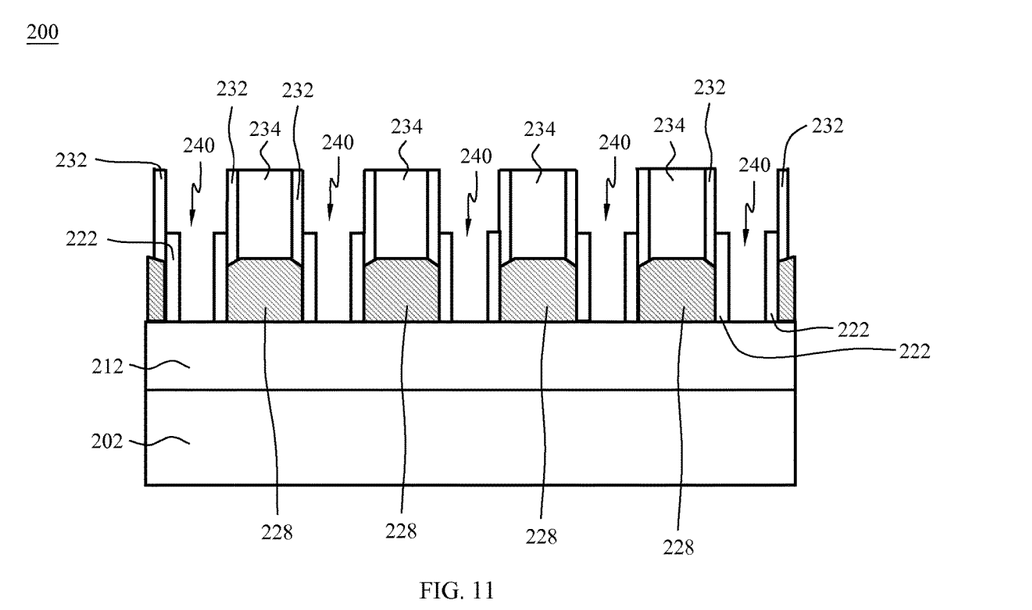
FIG. 11 depicts the structure of FIG. 10 after removing the barrier layer and the first polysilicon layer, in accordance with one or more aspects of the present invention.
Figure 12:
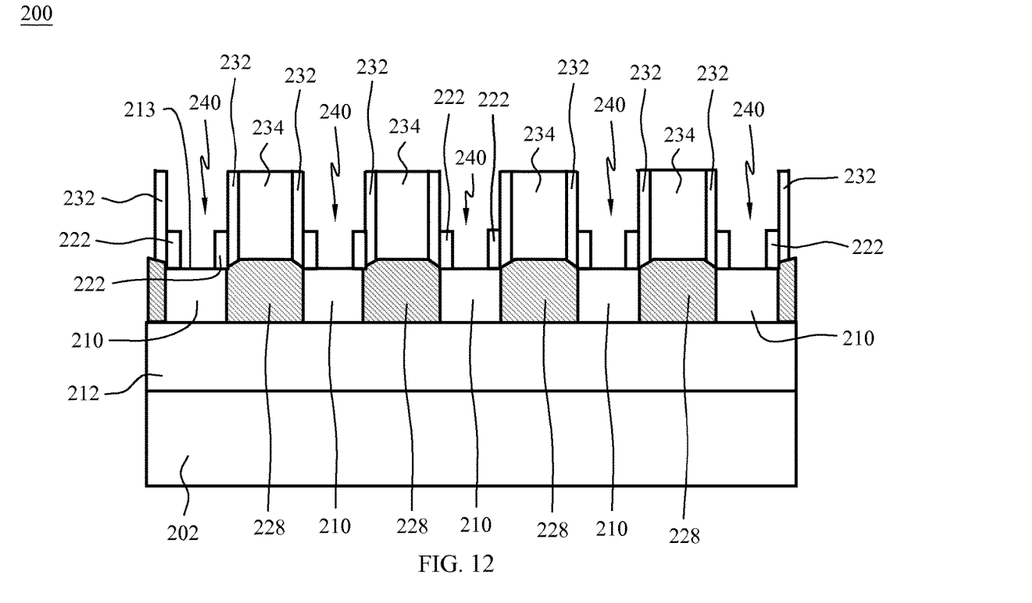
FIG. 12 depicts the structure of FIG. 11 taken along line 12-12 of FIG. 3, in accordance with one or more aspects of the present invention.

After the epitaxial layer 228 is grown, a second spacer formation process may be performed, as shown in FIGS. 6 and 7. The spacer formation process may include, for example, a conformal deposition of a second spacer material 230, as shown in FIG. 6. Then, a vertical etch may be performed to form the spacers 232, as shown in FIG. 7. Following formation of the spacers 232, an oxide layer 234 may be deposited over the device 200 and planarized down to the hard mask layer 220, as shown in FIG. 8. Next, as shown in FIG. 9, the hard mask caps 220 may be removed from between the spacers 222. In addition, a partial polysilicon etch may be performed removing the portion of the second polysilicon layer 218 between the spacers 222 down to the barrier layer 216 to form partial gate contact openings 236. Following the partial polysilicon etch, a reactive ion etch (RIE) may be performed to remove at least a portion of the first spacers 222 down to the barrier layer 216 forming widened partial gate contact openings 236, as shown in FIG. 10. As illustrated in FIG. 10, the entire portion of the first spacers 222 above the barrier layer 216 may be etched to form the widened openings 236. After the widened partial gate contact openings 236 are formed, the barrier layer 216 may be removed and a second polysilicon etch may be performed to remove the portions of first polysilicon layer 214 between the spacers 222 to form the gate contact openings 240, as shown in FIGS. 11 and 12. Finally, a gate contact or structure (not shown) may be deposited in the gate contact openings 240.

Figure 13:
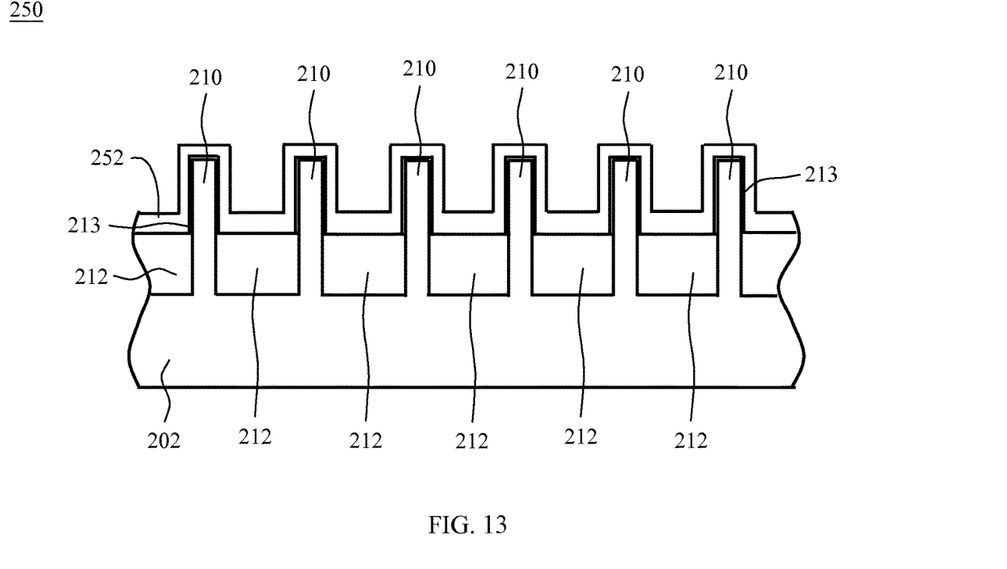
FIG. 13 depicts a cross-sectional elevation view of the semiconductor device of FIG. 2 taken along line 3-3, after depositing a conformal polysilicon layer, in accordance with one or more aspects of the present invention.
Figure 14:
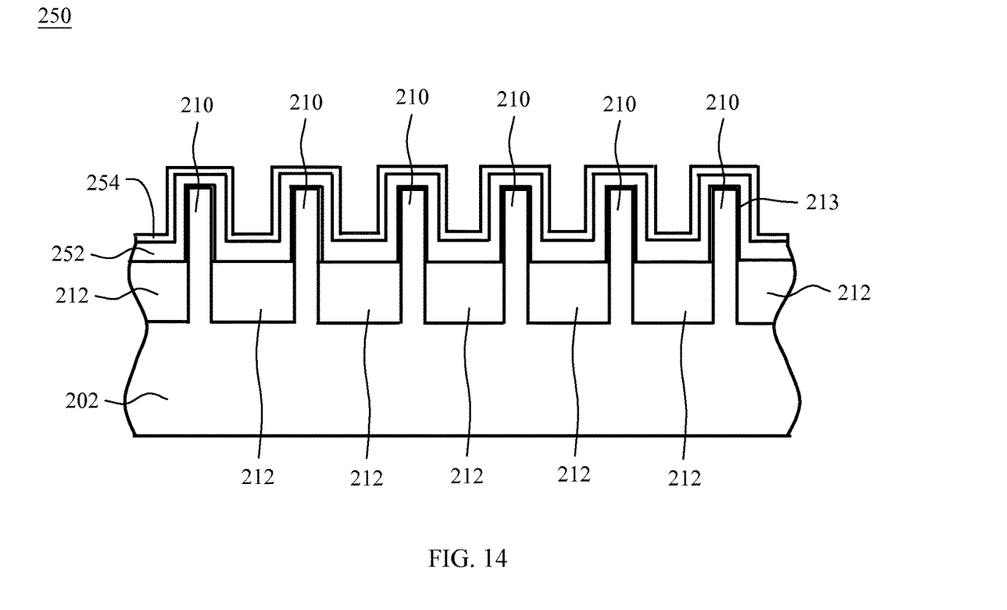
FIG. 14 depicts the structure of FIG. 13 after forming a barrier layer, in accordance with one or more aspects of the present invention.
Figure 15:
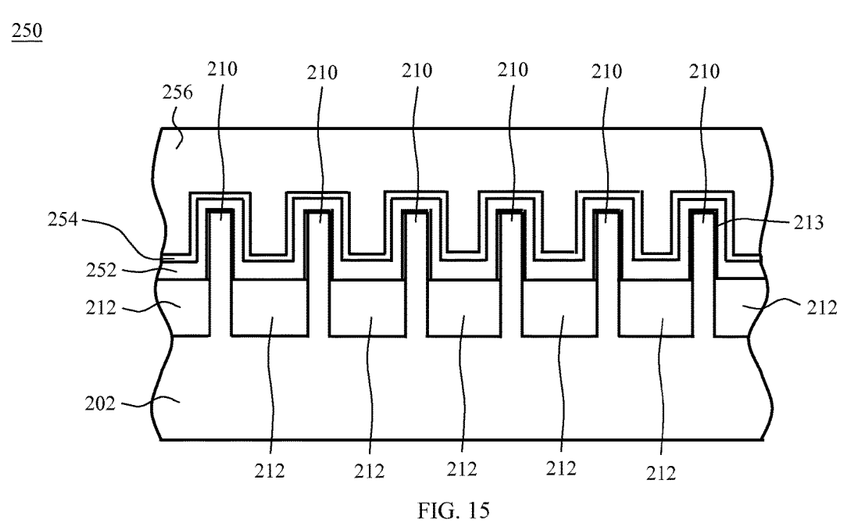
FIG. 15 depicts the structure of FIG. 14 after depositing a second polysilicon layer, in accordance with one or more aspects of the present invention.
Figure 16:
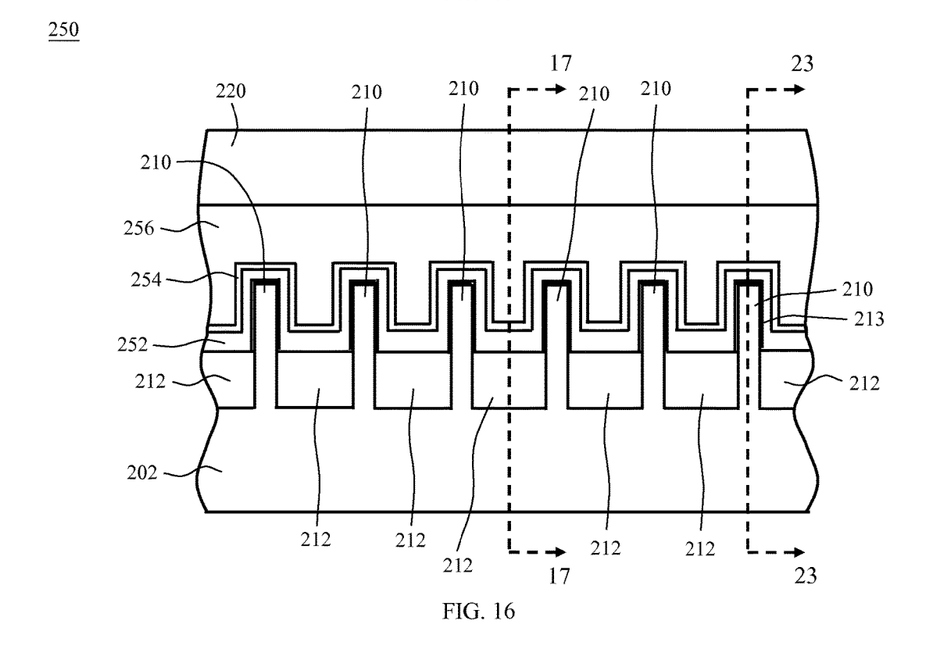
FIG. 16 depicts the structure of FIG. 15 after depositing a hard mask layer, in accordance with one or more aspects of the present invention.
Figure 17:
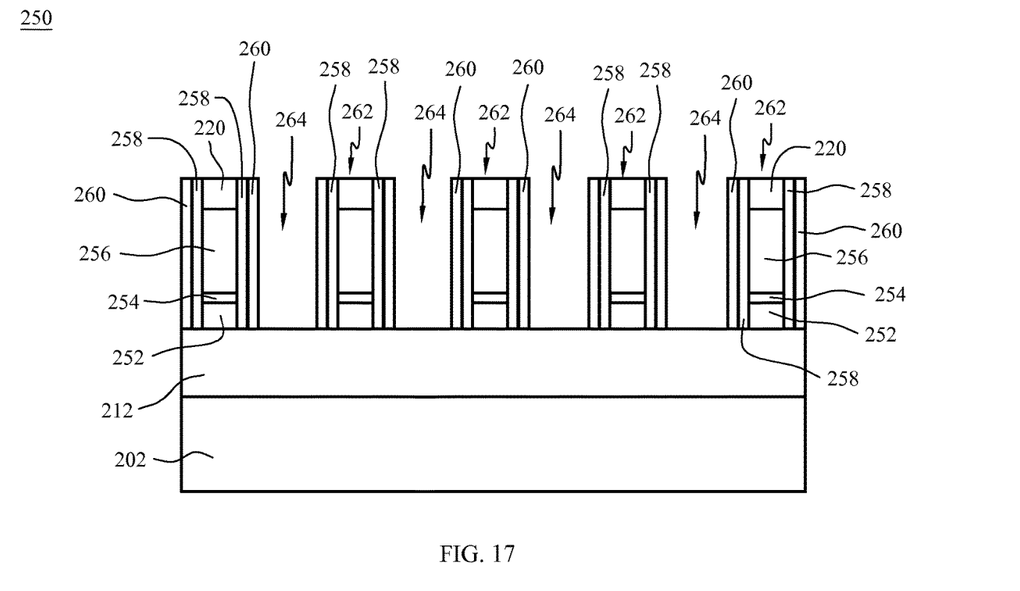
FIG. 17 depicts a cross-sectional elevation view of the semiconductor device of FIG. 16 taken along line 17-17 after forming first and second spacers adjacent to the sacrificial gates, in accordance with one or more aspects of the present invention.

FIGS. 13-23 depict, by way of example only, an alternative embodiment of a portion of the FinFET device formation process of FIG. 1. Note again that these figures are not drawn to scale in order to facilitate understanding of the invention, and that the same reference numerals are used throughout different figures to designate the same or similar elements. The device 250 may have been processed through the fabrication processes described in greater detail above with reference to FIG. 2. In addition, the device 250 may include an oxidation layer 213 formed over the portion of the fins 210 extending above the oxide layer 212 and the oxidation layer 213 may be, for example, approximately 2-3 nm thick. Then, as shown in FIG. 13, a conformal polysilicon layer 252 may be deposited over the device 250. A conformal barrier layer 254 may then be formed over the polysilicon layer 252, as shown in FIG. 14. The barrier layer 254 may be, for example, a deposited or formed silicon dioxide ($SiO_2$) layer. The barrier layer 254 may be formed by, for example, oxidizing the polysilicon layer 252 to form a $SiO_2$ layer. The barrier layer 254 may be a thin layer of, for example, approximately 1-4 nm and more preferably 2-3 nm. Next, a second polysilicon layer 256 may be deposited over the barrier layer 254 and planarization performed, as shown in FIG. 15. In addition, as shown in FIG. 16, a hard mask layer 220 may be deposited over the second polysilicon layer 256. Next, lithography and etching may be performed over the device 250 to form one or more sacrificial gates 262. The one or more sacrificial gates 262 may include a portion of the conformal polysilicon layer 252, the barrier layer 254, the second polysilicon layer 256, and the hard mask layer 220, as shown in FIG. 17. The hard mask layer 220 may form a hard mask cap 220 on the top of each sacrificial gate 262.

An alternative view of the device 250 is shown in FIG. 17, after formation of the first spacers 258 and second spacers 260 on the sides of the sacrificial gates 262. The spacers 258, 260 may be formed by known spacer formation methods after formation of the sacrificial gates 262. The first spacers 258 may be formed by, for example, depositing a conformal layer of the first spacer material and vertically etching to form the first spacers 258. Then, at least one layer of second spacers 260 may be formed adjacent to the first spacers 258 by, for example, depositing a conformal layer of second spacer material and vertically etching to form the second spacers 260.

Figure 18:
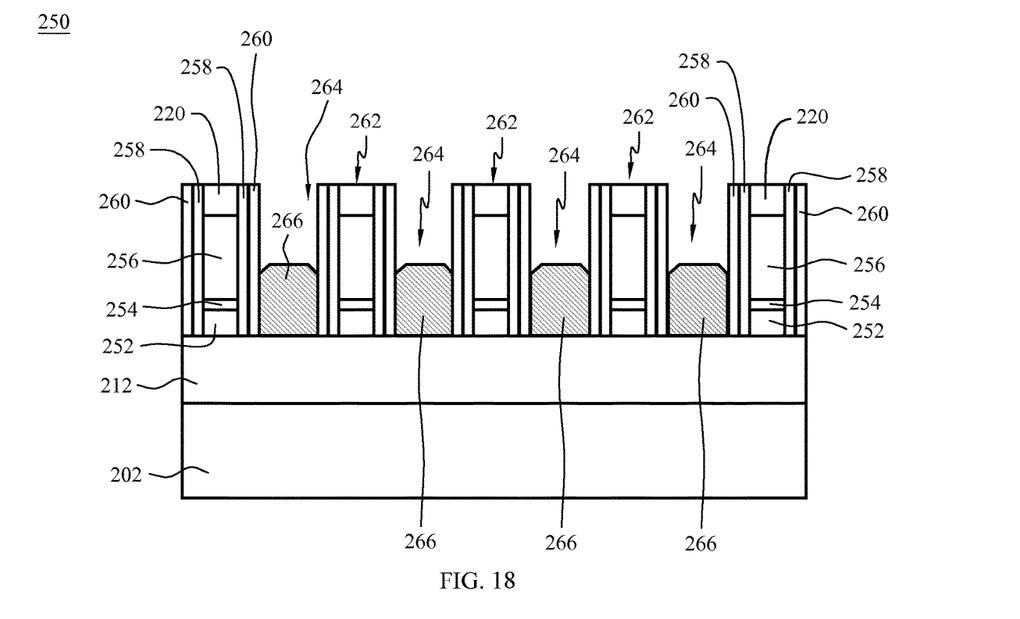
FIG. 18 depicts the structure of FIG. 17 after performing epitaxial growth between the spacers, in accordance with one or more aspects of the present invention.
Figure 19:
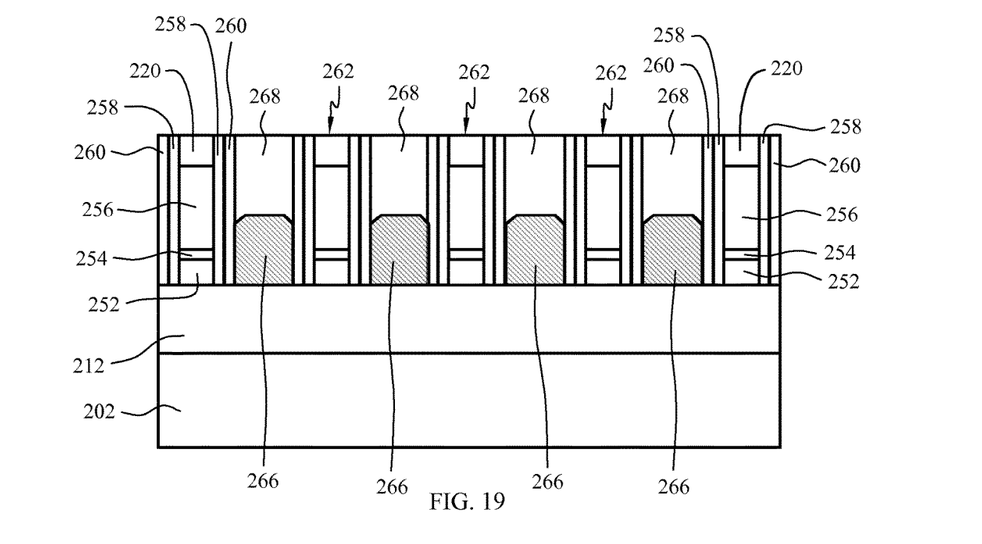
FIG. 19 depicts the structure of FIG. 18 after an oxide deposition and performing planarization, in accordance with one or more aspects of the present invention.
Figure 20:
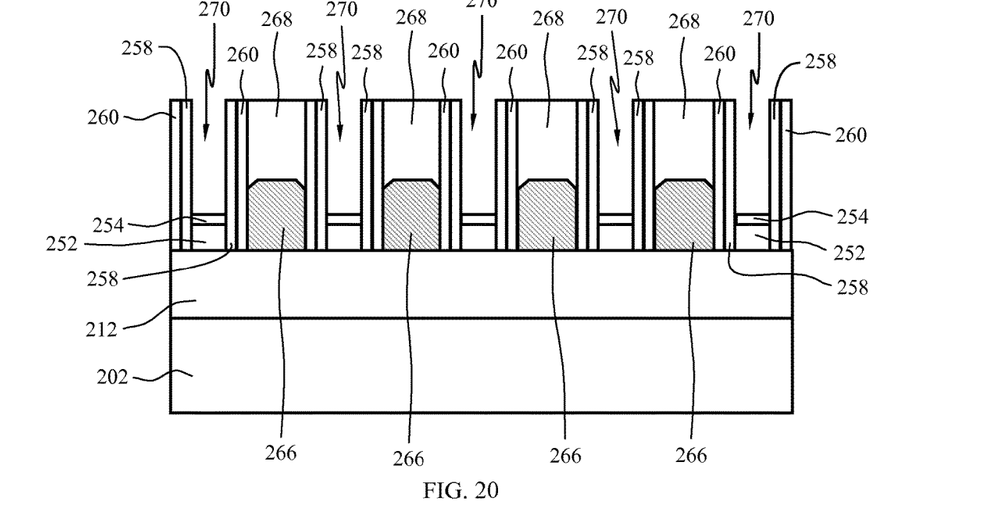
FIG. 20 depicts the structure of FIG. 19 after removing the hard mask caps and performing a partial polysilicon etch to remove the second polysilicon layer down to the barrier layer, in accordance with one or more aspects of the present invention.
Figure 21:
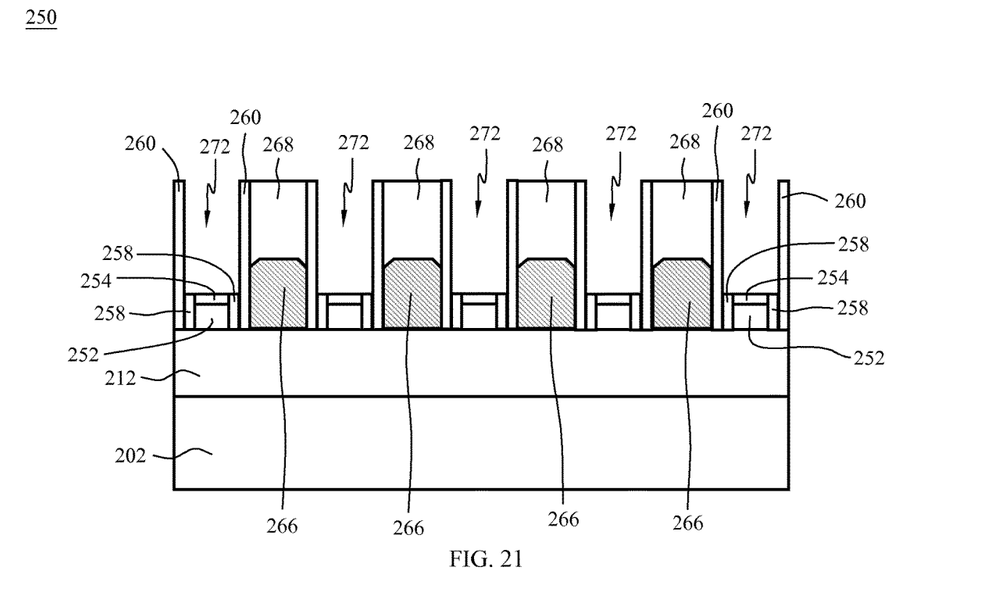
FIG. 21 depicts the structure of FIG. 20 after performing a reactive ion etch widening process down to the barrier layer, in accordance with one or more aspects of the present invention.
Figure 22:
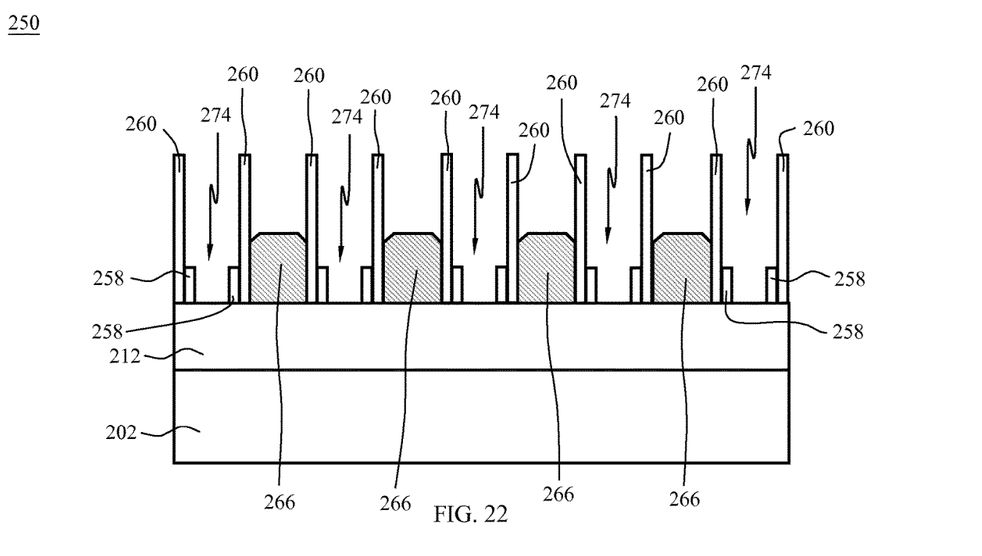
FIG. 22 depicts the structure of FIG. 21 after removing the barrier layer and the first polysilicon layer, in accordance with one or more aspects of the present invention.
Figure 23:
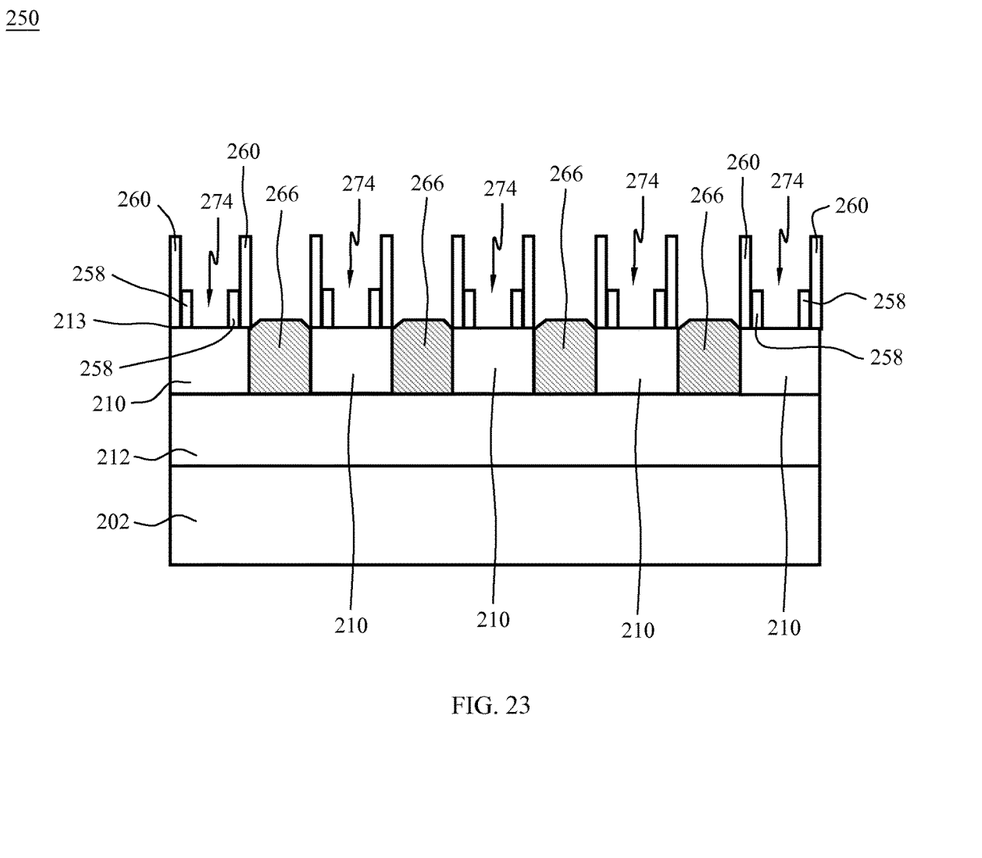
FIG. 23 depicts the structure of FIG. 22 taken along line 23-23 of FIG. 16, in accordance with one or more aspects of the present invention.

Once the spacers 258, 260 are formed, epitaxy may be grown in the openings 264 between the spacers 260 forming an epitaxial growth layer 266, as shown in FIG. 18. The epitaxial growth layer 266 may be formed, for example, over the at least one source region 204 and at least one drain region 206. The epitaxial growth layer 266 may be, for example, grown to a height that is above the height of the barrier layer 254. Following growth of the epitaxial layer 266, an oxide layer 268 may be deposited over the device 250 and planarized down to the hard mask layer 220, as shown in FIG. 19. Next, as shown in FIG. 20, the hard mask caps 220 may be removed from between the spacers 258. In addition, a partial polysilicon etch may be performed removing the portion of the second polysilicon layer 256 between the spacers 258 down to the barrier layer 254 and forming partial gate contact openings 270. Following the partial polysilicon etch, a reactive ion etch (RIE) may then be performed to remove at least a portion of the first spacers 258 down to the barrier layer 254 forming widened partial gate contact openings 272, as shown in FIG. 21. As illustrated in FIG. 21, the entire portion of the first spacers 258 above the barrier layer 254 may be etched to form the widened openings 272. After the widened partial gate contact openings 272 are formed, the barrier layer 254 may be removed and a second polysilicon etch may be performed to remove the portions of first polysilicon layer 252 between the spacers 258 to form the gate contact openings 274, as shown in FIGS. 22 and 23. Finally, gate contacts or structures (not shown) may be formed in the gate contact openings 274.

As may be recognized by those of ordinary skill in the art based on the teachings herein, numerous changes and modifications may be made to the above-described and other embodiments of the present invention without departing from the scope of the invention. For example, other components of the device and/or method as disclosed in the specification, including the accompanying abstract and drawings, may be replaced by alternative component(s) or features(s), such as those disclosed in another embodiment, which serve the same, equivalent or similar purpose as known by those skilled in the art to achieve the same, equivalent or similar results by such alternative component(s) or feature(s) to provide a similar function for the intended purpose. In addition, the devices and systems may include more or fewer components or features than the embodiments as described and illustrated herein. For example, the components and features of FIGS. 3-12 and FIGS. 13-23 may all be used interchangeably and in alternative combinations as would be modified or altered by one of skill in the art. Accordingly, this detailed description of the currently-preferred embodiments is to be taken as illustrative, as opposed to limiting of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining a wafer with at least one source, at least one drain, and at least one fin;
   forming at least one sacrificial gate with at least one barrier layer, comprising:
      depositing a first polysilicon layer over the wafer;
      forming the at least one barrier layer over the first polysilicon layer;
      depositing a second polysilicon layer over the barrier layer; and
      depositing a hard mask layer over the second polysilicon layer;
   forming a first set of spacers adjacent to the at least one sacrificial gate;
   forming at least one second set of spacers adjacent to the first set of spacers; and
   etching to remove a portion of the first set of spacers above the at least one barrier layer to form a widened opening.

2. The method of claim 1, wherein etching to remove a portion of the first set of spacers above the at least one barrier layer comprises:
   removing the hard mask layer; and
   etching to remove the second polysilicon layer down to the barrier layer.

3. The method of claim 2, further comprising:
   removing the barrier layer;
   etching to remove the first polysilicon layer to form an opening between a remaining portion of the first set of spacers.

4. The method of claim 3, further comprising:
   forming at least one gate contact in the widened opening and the opening between the remaining portion of the first set of spacers.

5. A method comprising:
   obtaining a wafer with at least one source, at least one drain, and at least one fin;
   forming at least one sacrificial gate with at least one barrier layer;
   forming a first set of spacers adjacent to the at least one sacrificial gate;
   forming at least one second set of spacers adjacent to the first set of spacers;
   etching to remove a portion of the first set of spacers above the at least one barrier layer to form a widened opening; and
   growing an epitaxial layer between at least one of the first set of spacers and the second set of spacers.

6. The method of claim 5, wherein the at least one second set of spacers is formed adjacent to a portion of the first set of spacers after the epitaxial layer is grown.

7. The method of claim 6, wherein the at least one second set of spacers is formed adjacent to the first set of spacers before the epitaxial layer is grown.

8. The method of claim 5, wherein the at least one barrier layer is positioned between a first end and a second end of the first set of spacers.

9. The method of claim 6, wherein the at least one barrier layer is positioned at a height above a top surface of the epitaxial layer.

10. The method of claim 7, wherein the at least one barrier layer is positioned at a height below a top surface of the epitaxial layer.

11. The method of claim 1, wherein the first polysilicon layer is conformally deposited over the at least one fin and the barrier layer is a conformal barrier layer.

12. The method of claim 1, wherein the first polysilicon layer is a full polysilicon deposition and the barrier layer is a planar layer formed over the first polysilicon layer.

* * * * *

UNITED STATES PATENT AND TRADEMARK OFFICE
CERTIFICATE OF CORRECTION

| | | |
|---|---|---|
| PATENT NO. | : 9,608,087 B2 | Page 1 of 1 |
| APPLICATION NO. | : 14/681428 | |
| DATED | : March 28, 2017 | |
| INVENTOR(S) | : Hui Zang | |

It is certified that error appears in the above-identified patent and that said Letters Patent is hereby corrected as shown below:

In the Claims

Column 8, Line 36:
Claim 7, Delete "claim 6" and insert --claim 5--

Signed and Sealed this
Ninth Day of May, 2017

Michelle K. Lee
*Director of the United States Patent and Trademark Office*